United States Patent
Lim et al.

(10) Patent No.: US 7,391,254 B2
(45) Date of Patent: Jun. 24, 2008

(54) CIRCUIT AND METHOD OF GENERATING INTERNAL SUPPLY VOLTAGE IN SEMICONDUCTOR MEMORY DEVICE

(75) Inventors: Jong-Hyoung Lim, Hwaseong-si (KR);
Sang-Seok Kang, Suwon-si (KR);
Sang-Man Byun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 98 days.

(21) Appl. No.: 11/521,178

(22) Filed: Sep. 14, 2006

(65) Prior Publication Data

US 2007/0070695 A1    Mar. 29, 2007

(30) Foreign Application Priority Data

Sep. 15, 2005  (KR)  ...................... 10-2005-0086089

(51) Int. Cl.
*G05F 1/10* (2006.01)
(52) U.S. Cl. .......................................... 327/538; 327/75
(58) Field of Classification Search .................. 327/74, 327/75, 530, 535, 537, 538, 543
See application file for complete search history.

(56) References Cited

U.S. PATENT DOCUMENTS 6,680,642 B2 *   1/2004   Edell et al. ................... 327/538
2004/0108890 A1  6/2004   Choi et al.
2004/0251957 A1  12/2004  Do

FOREIGN PATENT DOCUMENTS

| KR | 1020040048294 | 6/2004 |
|----|---------------|--------|
| KR | 1020040105976 | 12/2004 |
| KR | 1020050021112 | 3/2005 |

* cited by examiner

*Primary Examiner*—Jeffrey S Zweizig
(74) *Attorney, Agent, or Firm*—Mills & Onello LLP (57) ABSTRACT

An internal supply voltage generation circuit includes first and second driving circuits and a resistive device. The first driving circuit receives a feedback voltage from a first node and generates a first output voltage based on first and second reference voltages to provide the first output voltage to the first node. The first output voltage is maintained between the first and second reference voltages. The second driving circuit receives a feedback voltage from a second node voltage and generates a second output voltage based on third and fourth reference voltages to provide the second output voltage to the second node. The second output voltage is maintained between the third and fourth reference voltages, and the second output voltage of the second node is provided as an internal supply voltage. The resistive device is coupled between the first and second nodes.

20 Claims, 4 Drawing Sheets

CIRCUIT AND METHOD OF GENERATING INTERNAL SUPPLY VOLTAGE IN SEMICONDUCTOR MEMORY DEVICE

CROSS-REFERENCE TO RELATED APPLICATIONS

This application claims priority under 35 U.S.C. §119 to Korean Patent Application No. 10-2005-0086089 filed on Sep. 15, 2005 in the Korean Intellectual Property Office (KIPO), the entire contents of which are herein incorporated by reference.

BACKGROUND OF THE INVENTION

1. Field of the Invention

The present invention relates to a semiconductor memory device, and more particularly to a circuit and a method of generating a stable internal supply voltage in a semiconductor memory device.

2. Description of the Related Art

Semiconductor memory devices are typically used for storing data, such as still images, videos, music, and so on. Random-access memory (RAM) is a type of volatile memory, and is generally used as the main memory of a computer system. Dynamic RAM (DRAM) is a kind of RAM and includes memory cells. A memory cell may include a single cell transistor and a single cell capacitor, and may store information represented as '0' or '1' in the cell capacitor.

The DRAM memory cells are coupled to a word line and a bit line. When the cell transistor included in the memory cell is turned on in response to a word line enable signal, data stored in the cell capacitor is output to the bit line, or data in the bit line is stored in the cell capacitor.

One terminal of the cell capacitor included in the memory cell is coupled to the cell transistor, and the other terminal of the cell capacitor is coupled to a cell plate. A cell plate voltage VP is applied to a cell plate, and the cell plate voltage VP is generated by a cell plate voltage generator. A capacitance of the cell capacitor is related to data preservation capability, and is determined by a physical area of the cell capacitor and a voltage between both ends of the cell capacitor.

Internal supply voltages used in a semiconductor memory device may include the cell plate voltage VP used in the cell capacitor of the memory cell, and a bit-line precharge voltage VBLP.

Figure 1:
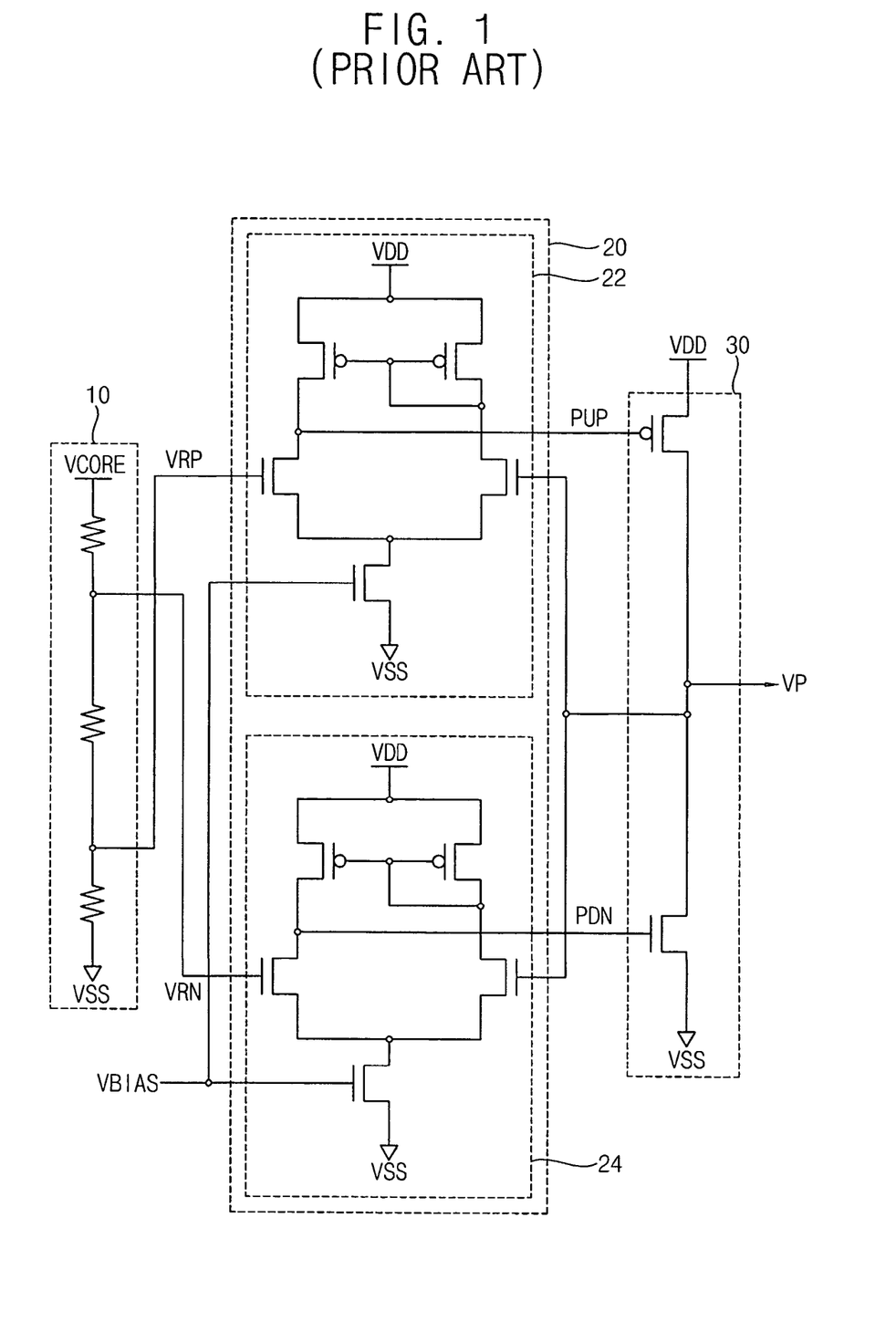
FIG. 1 is a circuit diagram illustrating a conventional internal supply voltage generation circuit.

FIG. 1 is a circuit diagram illustrating a conventional internal supply voltage generation circuit, which is disclosed in Korean Patent Laid-Open Publication No. 2004-105976. Referring to FIG. 1, the internal supply voltage generation circuit includes a reference voltage divider 10, a comparator 20 having differential amplifiers 22 and 24, and a driver 30. The internal supply voltage generation circuit generates the cell plate voltage VP of the memory cell in response to two reference voltages VRP and VRN.

Accordingly, as the DRAM devices become highly integrated, the number of memory cells to which a cell plate voltage generation device must provide the cell plate voltage is increased. Consequently, a cell plate voltage generation device capable of generating a large supply voltage is required.

Additionally, as the DRAM devices become highly integrated, the cell plate voltage may become unstable during a setup time, and the setup time may become long in the semiconductor memory device that includes the conventional internal supply voltage generation circuit.

SUMMARY OF THE INVENTION

In accordance with various aspects of the present disclosure, provided is an internal supply voltage generation circuit capable of generating an internal supply voltage that is stable during setup and has a short setup time.

In accordance with other aspects of the present disclosure provided is a semiconductor memory device capable of having an internal supply voltage circuit that is stable during setup and has a short setup time.

In accordance with still other aspects of the present disclosure, provided is an internal supply voltage generation method capable of generating an internal supply voltage that is stable during a setup and has a short setup time.

In accordance with one aspect of the present disclosure, provided is an internal supply voltage generation circuit in a semiconductor device that includes a first driving circuit, a second driving circuit and a resistive device. The first driving circuit is configured to receive a feedback voltage of a first node and to generate a first output voltage based on first and second reference voltages to provide the first output voltage to the first node. The first output voltage is maintained between the first and second reference voltages. The second driving circuit is configured to receive a feedback voltage of a second node and to generate a second output voltage based on third and fourth reference voltages to provide the second output voltage to the second node. The second output voltage is maintained between the third and fourth reference voltages, and the second output voltage of the second node is provided as an internal supply voltage. The resistive device is coupled between the first and second nodes.

The internal supply voltage can be used as a cell plate voltage applied to a memory cell in the semiconductor memory device.

The resistive device can be formed with a parasitic resistor included in a transmission line arranged between an output terminal of the first driving circuit and an output terminal of the second driving circuit.

The first reference voltage can have a larger value than the second reference voltage.

The third reference voltage can have a larger value than the first reference voltage by a first voltage difference and the fourth reference voltage cart have a larger value than the second reference voltage by a second voltage difference.

The first driving circuit can include: a first amplifier configured to amplify a voltage difference between the first reference voltage and the feedback voltage of the first node, to generate a pull-up control signal; a second amplifier configured to amplify a voltage difference between the second reference voltage and the feedback voltage of the first node, to generate a pull-down control signal; a pull-up transistor configured to pull up the first output voltage of the first node in response to the pull-up control signal; and a pull-down transistor configured to pull down the first output voltage of the first node in response to the pull-down control signal.

The second driving circuit can include: a third amplifier configured to amplify a voltage difference between the third reference voltage and the feedback voltage of the second node, to generate a pull-up control signal; a fourth amplifier configured to amplify a voltage difference between the fourth reference voltage and the feedback voltage of the second node, to generate a pull-down control signal; a pull-up transistor configured to pull up the second output voltage of the second node in response to the pull-up control signal; and a pull-down transistor configured to pull down the second output voltage of the second node in response to the pull-down control signal.

The internal supply voltage generation circuit can further include a reference voltage generation circuit configured to generate the first through the fourth reference voltages.

The reference voltage generation circuit can include: a first resistor configured to be coupled between a first supply voltage and a first reference node; a second resistor configured to be coupled between the first reference node and a second reference node; a third resistor configured to be coupled between the second reference node and a third reference node; a fourth resistor configured to be coupled between the third reference node and a fourth reference node; and a fifth resistor configured to be coupled between the fourth reference node and a second supply voltage.

The fourth reference voltage can be generated at the first reference node, the second reference voltage can be generated at the second reference node, the first reference voltage can be generated at the third reference node, and the third reference voltage can be generated at the fourth reference node.

In accordance with another aspect of the present disclosure, provided is a semiconductor memory device that includes a plurality of memory cells respectively having a cell plate terminal to which a cell plate voltage is applied; and an internal supply voltage generation circuit configured to provide the cell plate voltage to the memory cells. The internal supply voltage generation circuit includes a first driving circuit configured to receive a feedback voltage of a first node, and configured to generate a first output voltage based on first and second reference voltages to provide the first output voltage to the first node, the first output voltage being maintained between the first and second reference voltages; a second driving circuit configured to receive a feedback voltage of a second node, and configured to generate a second output voltage based on third and fourth reference voltages to provide the second output voltage as the cell plate voltage to the second node, the second output voltage being maintained between the third and fourth reference voltages; and a resistive device coupled between the first and second nodes.

The resistive device can be formed with a parasitic resistor included in a transmission line arranged between an output terminal of the first driving circuit and an output terminal of the second driving circuit.

In accordance with still another aspect of the present disclosure, provided is a method of generating an internal supply voltage in a semiconductor memory device. The method includes: generating a first output voltage by comparing first and second reference voltages with a feedback voltage from a first node to provide the first output voltage to the first node, the first output voltage being maintained between the first and second reference voltages; generating a second output voltage by comparing third and fourth reference voltages with a feedback voltage from a second node to provide the second output voltage to the second node, the second output voltage being maintained between the third and fourth reference voltages; and providing the second output voltage as an internal supply voltage through the second node.

The method can further comprise maintaining a predetermined voltage difference between the first node and the second node.

The method can further comprise generating the predetermined voltage difference by a parasitic resistor included in an impedance circuit disposed between the first node and the second node.

The internal supply voltage can be a cell plate voltage applied to a memory cell in a semiconductor memory device.

Generating the first output voltage can comprise: generating a pull-up control signal by amplifying a voltage difference between the first reference voltage and the feedback voltage of the first node; generating a pull-down control signal by amplifying a voltage difference between the second reference voltage and the feedback voltage of the first node; pulling up the first output voltage of the first node in response to the pull-up control signal; and pulling down the first output voltage of the first node in response to the pull-down control signal.

Generating the second output voltage can comprise: generating a pull-up control signal by amplifying a voltage difference between the third reference voltage and the feedback voltage of the second node; generating a pull-down control signal by amplifying a voltage difference between the fourth reference voltage and the feedback voltage of the second node; pulling up the second output voltage of the second node in response to the pull-up control signal; and pulling down the second output voltage of the second node in response to the pull-down control signal.

The first reference voltage can have a larger value than the second reference voltage.

The third reference voltage can have a larger value than the first reference voltage by a first voltage difference and the fourth reference voltage can have a larger value than the second reference voltage by a second voltage difference.

Therefore, an internal supply voltage generated by a circuit or method according to the present disclosure is stable during setup and has a short setup time.

BRIEF DESCRIPTION OF THE DRAWINGS

Various aspects of the invention will become more apparent in view of the attached drawing figures, which are provided by way of example, not by way of limitation, in which.

DESCRIPTION OF THE EMBODIMENTS

The accompanying drawings are described below, in which example embodiments in accordance with the present invention are shown. Specific structural and functional details disclosed herein are merely representative. This invention may be embodied in many alternate forms and should not be construed as limited to example embodiments set forth herein.

Accordingly, specific embodiments are shown by way of example in the drawings. It should be understood, however, that there is no intent to limit the invention to the particular forms disclosed, but on the contrary, the invention is to cover all modifications, equivalents, and alternatives falling within the spirit and scope of the claims. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "on," "connected to" or "coupled to" another element, it can be directly on, connected to or coupled to the other element or intervening elements may be present. In contrast, when an element is referred to as being "directly on," "directly connected to" or "directly coupled to" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprise," "comprises," "comprising," "include," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 2:
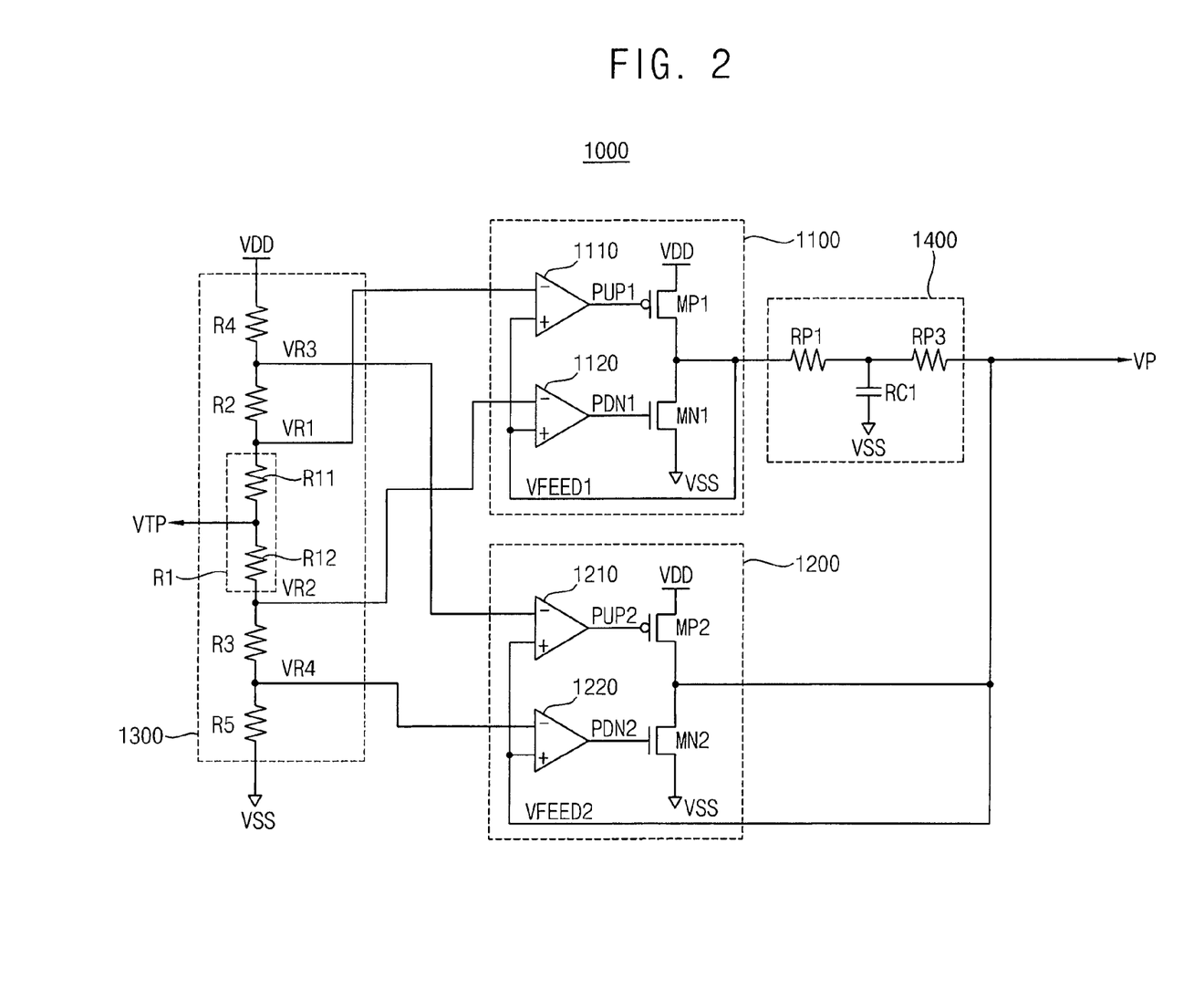
FIG. 2 is a circuit diagram illustrating an example embodiment of an internal supply voltage generation circuit in accordance with aspects of the present invention.

FIG. 2 is a circuit diagram illustrating an example embodiment of an internal supply voltage generation circuit 1000. The internal supply voltage generation circuit 1000 may include a first driving circuit 1100 and a second driving circuit 1200. The first driving circuit 1100 receives a first feedback voltage VFEED1, and generates a voltage based on a first reference voltage VR1 and a second reference voltage VR2. The first driving circuit 1100 provides a voltage that is stabilized or maintained between the first reference voltage VR1 and the second reference voltage VR2.

The second driving circuit 1200 receives a second feedback voltage VFEED2, and generates a voltage based on a third reference voltage VR3 and a fourth reference voltage VR4. The second driving circuit 1200 provides a voltage that is stabilized or maintained between the third reference voltage VR3 and the fourth reference voltage VR4.

The internal supply voltage generation circuit 1000 can further include an impedance circuit 1400 coupled between an output terminal of the first driving circuit 1100 and an output terminal of the second driving circuit 1200.

In this embodiment, the impedance circuit 1400 includes resistors RP1 and RP3, and a capacitor RC1, which can comprise a parasitic resistor and a parasitic capacitor included in a transmission line between the output terminal of the first driving circuit and the output terminal of the second driving circuit. Particularly, the impedance circuit 1400 may be an electric conducting wire that is arranged near the cell plate coupled to the memory cell.

The first driving circuit 1100 can include differential amplifiers 1110 and 1120, a pull-up transistor MP1 and a pull-down transistor MN1. The first differential amplifier 1110 amplifies a voltage difference between the first reference voltage VR1 and the first feedback voltage VFEED1, to generate a pull-up control signal PUP1. The second differential amplifier 1120 amplifies a voltage difference between the second reference voltage VR2 and the first feedback voltage VFEED1, to generate a pull-down control signal PDN1.

The pull-up transistor MP1 pulls up a voltage of the output terminal of the first driving circuit 1100 in response to the pull-up control signal PUP1. The pull-down transistor MN1 pulls down a voltage of the output terminal of the first driving circuit 1100 in response to the pull-down control signal PDN1.

The second driving circuit 1200 can include differential amplifiers 1210 and 1220, a pull-up-transistor MP2 and a pull-down transistor MN2. The third differential amplifier 1210 amplifies a voltage difference between the third reference voltage VR3 and the second feedback voltage VFEED2, to generate a pull-up control signal PUP2. The fourth differential amplifier 1220 amplifies a voltage difference between the fourth reference voltage VR4 and the second feedback voltage VFEED2, to generate a pull-down control signal PDN2.

The pull-up transistor MP2 pulls up a voltage of the output terminal of the second driving circuit 1200 in response to the pull-up control signal PUP2. The pull-down transistor MN2 pulls down a voltage of the output terminal of the second driving circuit 1200 in response to the pull-down control signal PDN2.

Additionally, the internal supply voltage generation circuit 1000 can further include a reference voltage generation circuit that generates the first through the fourth reference voltages VR1 through VR4. In the embodiment of FIG. 2, the reference voltage generation circuit 1300 includes resistors R1 through R5. A first terminal of the first resistor R5 is coupled to a ground voltage VSS. A first terminal of the second resistor R3 is coupled to a second terminal of the first resistor R5. A first terminal of the third resistor R1 is coupled to a second terminal of the second resistor R3. A first terminal of the fourth resistor R2 is coupled to a second terminal of the third resistor R1. The fifth resistor R4 is coupled between the second terminal of the fourth resistor R2 and a supply voltage VDD. That is, the first through fifth resistors are coupled in series between the ground voltage VSS and the power supply voltage VDD.

The third resistor R1 can be configured with resistors R11 and R12 coupled in series, and the resistors R11 and R12 may have substantially the same resistance value. A voltage VTP of a connection node between the resistor R11 and the resistor R12 indicates a target value of the cell plate voltage VP.

Figure 3:
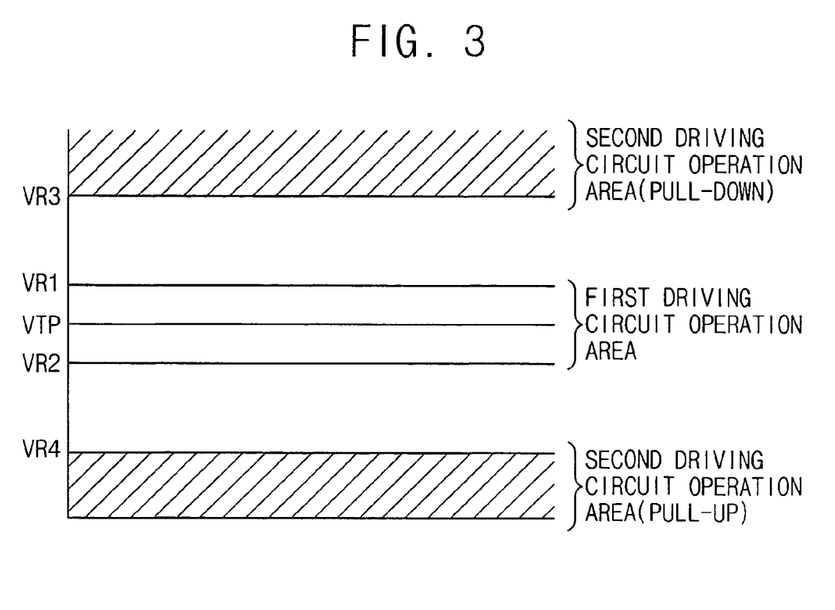
FIG. 3 is a graph illustrating operation areas of the internal supply voltage generation circuit in FIG. 2.

FIG. 3 is a graph illustrating operation areas or bands of the internal supply voltage generation circuit in 1000 FIG. 2. The vertical axis represents voltage, against which the bands are depicted in a relative manner, as discussed below. Hereinafter, the operation of the internal supply voltage generation circuit will be described with reference to FIG. 2 and FIG. 3.

As illustrated in FIG. 2, the internal supply voltage generation circuit 1000 includes two driving circuits 1100 and 1200 used to generate the stabilized cell plate voltage VP. The first through fourth reference voltages, VR1 through VR4, can be generated by the reference voltage generation circuit 1300.

Referring to FIG. 3, the first and second reference voltages VR1 and VR2 have substantially symmetric values about the center of the target value VTP. The third reference voltage VR3 has a larger value than the first reference voltage VR1, and the fourth reference voltage has a smaller value than the second reference voltage VR2.

When the cell plate voltage VP in the first driving circuit 1100 has a value between the first reference voltage VR1 and the second reference voltage VR2, the first driving circuit 1100 can perform a normal stabilization operation.

Similarly, when the cell plate voltage VP in the second driving circuit 1200 has a larger value than the third reference voltage VR3 or a smaller value than the fourth reference voltage VR4, the second driving circuit 1200 can perform a normal stabilization operation.

The first differential amplifier 1110 performs a negative feedback operation on the first feedback voltage VFEED1, and amplifies a voltage difference between the first reference voltage VR1 and the first feedback voltage VFEED1 to generate the pull-up control signal PUP1. The second differential amplifier 1120 performs a negative feedback operation on the first feedback voltage VFEED1, and amplifies a voltage difference between the second reference voltage VR2 and the first feedback voltage VFEED1, to generate the pull-down control signal PDN1.

When the first feedback voltage VFEED1 increases, the pull-up control signal PUP1 and the pull-down control signal PDN1 increase and a current flowing through the pull-down transistor MN1 increases. Consequently, an output voltage of the first driving circuit 1100 decreases. Similarly, when the first feedback voltage VFEED1 decreases, the pull-up control signal PUP1 and the pull-down control signal PDN1 decrease and a current flowing through the pull-up transistor MP1 increases. Consequently, an output voltage of the first driving circuit 1100 increases. A reference voltage of the first differential amplifier 1110 is the first reference voltage VR1, and a reference voltage of the second differential amplifier 1120 is the second reference voltage VR2.

The third differential amplifier 1210 performs a negative feedback operation on the second feedback voltage VFEED2, and amplifies a voltage difference between the third reference voltage VR3 and the second feedback voltage VFEED2, to generate the pull-up control signal PUP2. The fourth differential amplifier 1220 performs a negative feedback operation on the second feedback voltage VFEED2, and amplifies a voltage difference between the fourth reference voltage VR4 and the second feedback voltage VFEED2, to generate the pull-down control signal PDN2.

When the second feedback voltage VFEED2 increases, the pull-up control signal PUP2 and the pull-down control signal PDN2 increase and a current flowing through the pull-down transistor MN2 increases. Therefore, an output voltage of the second driving circuit 1200 decreases. Similarly, when the second feedback, voltage VFEED2 decreases, the pull-up control signal PUP2 and the pull-down control signal PDN2 decrease and a current flowing through the pull-up transistor MP2 increases. Therefore, an output voltage of the second driving circuit 1200 increases.

There can be a predetermined voltage difference between the output terminal of the first driving circuit 1100 and the output terminal of the second driving circuit 1200, and the voltage difference corresponds to a voltage drop through the impedance circuit 1400. The impedance circuit 1400 can be configured with an electric wire, particularly a layer of polysilicon arranged near the cell plate terminal.

The internal supply voltage generation circuit 1000 according to an example embodiment of the present disclosure has a short setup time for a wide range of feedback voltages, and generates a stable cell plate voltage.

Figure 4:
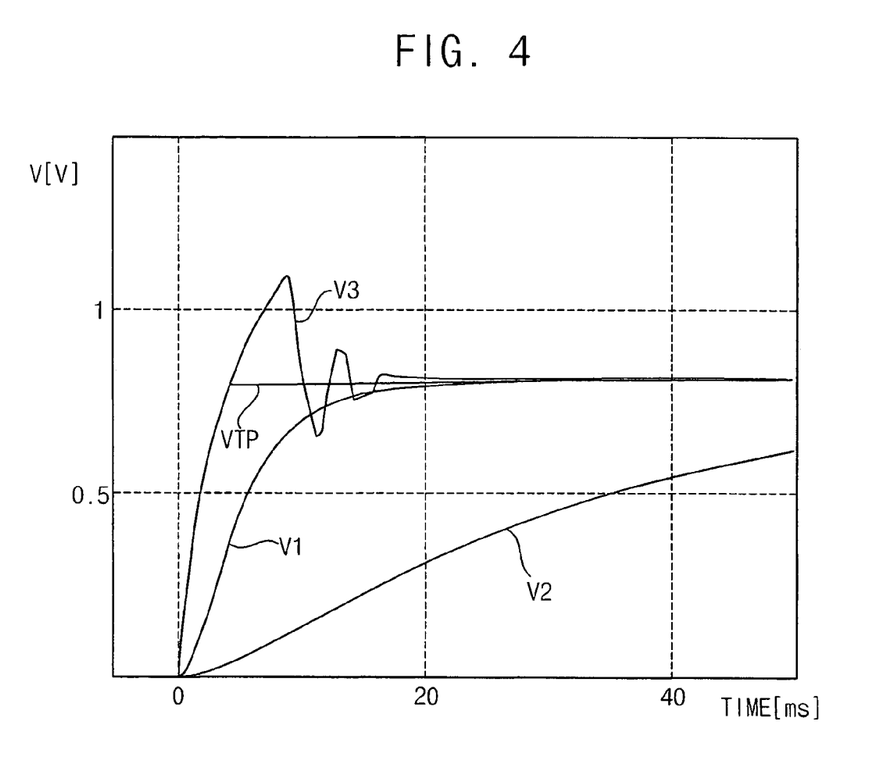
FIG. 4 is a graph illustrating setup times for the conventional internal supply voltage generation circuit and the internal supply voltage generation circuit according to an example embodiment of the present invention.

FIG. 4 is a graph illustrating setup times for the conventional internal supply voltage generation circuit and the internal supply voltage generation circuit according to an example embodiment of the present disclosure. Referring to FIG. 4, a curve V1 indicates a waveform of a cell plate voltage generated by the internal supply voltage generation circuit according to an example embodiment of the present disclosure. A curve V2 indicates a waveform of a cell plate voltage curve generated by the conventional internal supply voltage generation circuit, such as that of FIG. 1.

Curve V3 is a plot of the simulated cell plate voltage when: (1) the pull-up transistor size included in the driver 30 in FIG. 1 is substantially the same as the pull-up transistor size of the first driving circuit 1000 plus the pull-up transistor size of the second driving circuit 2000: and (2) the pull-down transistor size is substantially the same as the pull-down transistor size of the first driving circuit 1000 plus the pull-down transistor size of the second driving circuit 2000.

In FIG. 4, the curve V1 of the cell plate voltage generated by the internal supply voltage generation circuit 1000, according to an example embodiment of the present disclosure, has a short setup time and stably approaches the target value VTP.

The curve V2 of the cell plate voltage generated by the conventional art in FIG. 1 has a long setup time in comparison with the curve V1 of the cell plate voltage generated by the internal supply voltage generation circuit 1000. Additionally, when the sizes of the pull-up transistor and the pull-down transistor are increased in the conventional internal supply voltage generation circuit of FIG. 1, the cell plate voltage curve V3 severely fluctuates during an initial setup time.

Figure 5:
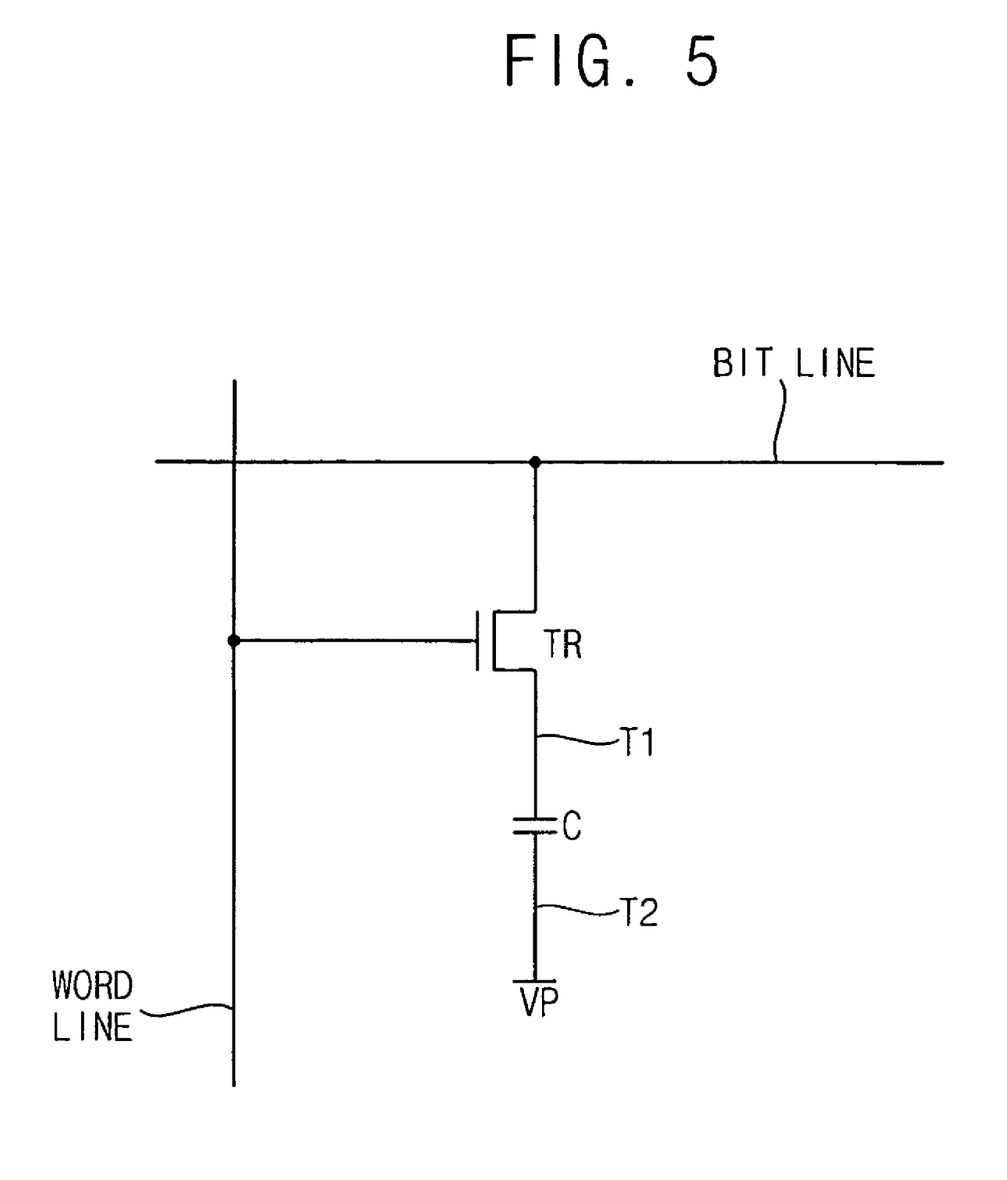
FIG. 5 is a circuit diagram illustrating a dynamic random-access memory (DRAM) cell using the cell plate voltage generated by the internal supply voltage generation circuit according to aspects of an example embodiment of the present invention.

FIG. 5 is a circuit diagram illustrating a dynamic random-access memory (DRAM) cell using the cell plate voltage generated by an internal supply voltage generation circuit according to an example embodiment of the present disclosure, such as that of FIG. 2.

In the example embodiment of FIG. 5, the memory cell can include a cell transistor TR and a cell capacitor C. The cell transistor TR has an input terminal coupled to a word line and a first output terminal coupled to a bit line. The cell capacitor C includes a first terminal T1 coupled to a second output terminal of the cell transistor TR, and a second terminal T2 to which the cell plate voltage VP is applied. The cell plate voltage VP can be generated by the internal supply voltage generation circuit 1000.

As described above, various embodiments of an internal supply voltage generation circuit according to the present disclosure includes two driving circuits, to generate an internal supply voltage that has a short setup time and is stable during the setup time.

Example embodiments in accordance with various aspects of the present invention being thus described, it will be appreciated by those skilled in the art that the same may be varied in many ways. For example, the example embodiments described above use an output voltage of the internal supply voltage generation circuit as the cell plate voltage. However, the output voltage of the internal supply voltage generation circuit can be applied to other portions of a semiconductor device requiring an internal supply voltage.

Such variations are not to be regarded as a departure from the spirit and scope of the present disclosure, and all such modifications are intended to be included within the scope of the following claims.

What is claimed is:

1. An internal supply voltage generation circuit in a semiconductor device, comprising:
   a first driving circuit configured to receive a feedback voltage of a first node, and configured to generate a first output voltage based on first and second reference voltages to provide the first output voltage to the first node, the first output voltage being maintained between the first and second reference voltages;
   a second driving circuit configured to receive a feedback voltage of a second node, and configured to generate a second output voltage based on third and fourth reference voltages to provide the second output voltage to the second node, the second output voltage being maintained between the third and fourth reference voltages, the second output voltage of the second node being provided as an internal supply voltage; and a resistive device coupled between the first and second nodes.

2. The internal supply voltage generation circuit of claim 1, wherein the internal supply voltage is a cell plate voltage applied to a memory cell in the semiconductor memory device.

3. The internal supply voltage generation circuit of claim 1, wherein the resistive device is formed with a parasitic resistor included in a transmission line arranged between an output terminal of the first driving circuit and an output terminal of the second driving circuit.

4. The internal supply voltage generation circuit of claim 1, wherein the first reference voltage has a larger value than the second reference voltage.

5. The internal supply voltage generation circuit of claim 4, wherein the third reference voltage has a larger value than the first reference voltage by a first voltage difference and the fourth reference voltage has a larger value than the second reference voltage by a second voltage difference.

6. The internal supply voltage generation circuit of claim 1, wherein the first driving circuit comprises:
a first amplifier configured to amplify a voltage difference between the first reference voltage and the feedback voltage of the first node, to generate a pull-up control signal;
a second amplifier configured to amplify a voltage difference between the second reference voltage and the feedback voltage of the first node, to generate a pull-down control signal;
a pull-up transistor configured to pull up the first output voltage of the first node in response to the pull-up control signal; and
a pull-down transistor configured to pull down the first output voltage of the first node in response to the pull-down control signal.

7. The internal supply voltage generation circuit of claim 1, wherein the second driving circuit comprises:
a third amplifier configured to amplify a voltage difference between the third reference voltage and the feedback voltage of the second node, to generate a pull-up control signal;
a fourth amplifier configured to amplify a voltage difference between the fourth reference voltage and the feedback voltage of the second node, to generate a pull-down control signal;
a pull-up transistor configured to pull up the second output voltage of the second node in response to the pull-up control signal; and
a pull-down transistor configured to pull down the second output voltage of the second node in response to the pull-down control signal.

8. The internal supply voltage generation circuit of claim 1, further comprising:
a reference voltage generation circuit configured to generate the first through the fourth reference voltages.

9. The internal supply voltage generation circuit of claim 8, wherein the reference voltage generation circuit comprises:
a first resistor configured to be coupled between a first supply voltage and a first reference node;
a second resistor configured to be coupled between the first reference node and a second reference node;
a third resistor configured to be coupled between the second reference node and a third reference node;
a fourth resistor configured to be coupled between the third reference node and a fourth reference node; and
a fifth resistor configured to be coupled between the fourth reference node and a second supply voltage.

10. The internal supply voltage generation circuit of claim 9, wherein the fourth reference voltage is generated at the first reference node, the second reference voltage is generated at the second reference node, the first reference voltage is generated at the third reference node, and the third reference voltage is generated at the fourth reference node.

11. A semiconductor memory device, comprising:
a plurality of memory cells respectively having a cell plate terminal to which a cell plate voltage is applied; and
an internal supply voltage generation circuit configured to provide the cell plate voltage to the memory cells, the internal supply voltage generation circuit comprising:
a first driving circuit configured to receive a feedback voltage of a first node, and configured to generate a first output voltage based on first and second reference voltages to provide the first output voltage to the first node, the first output voltage being maintained between the first and second reference voltages;
a second driving circuit configured to receive a feedback voltage of a second node, and configured to generate a second output voltage based on third and fourth reference voltages to provide the second output voltage as the cell plate voltage to the second node, the second output voltage being maintained between the third and fourth reference voltages; and
a resistive device coupled between the first and second nodes.

12. The semiconductor memory device of claim 11, wherein the resistive device is formed with a parasitic resistor included in a transmission line arranged between an output terminal of the first driving circuit and an output terminal of the second driving circuit.

13. A method of generating an internal supply voltage in a semiconductor memory device, comprising:
generating a first output voltage by comparing first and second reference voltages with a feedback voltage of a first node to provide the first output voltage to the first node, the first output voltage being maintained between the first and second reference voltages;
generating a second output voltage by comparing third and fourth reference voltages with a feedback voltage of a second node to provide the second output voltage to the second node, the second output voltage being maintained between the third and fourth reference voltages; and
providing the second output voltage as an internal supply voltage through the second node.

14. The method of claim 13, further comprising maintaining a predetermined voltage difference between the first node and the second node.

15. The method of claim 14, further comprising generating the predetermined voltage difference by a parasitic resistor included in an impedance circuit disposed between the first node and the second node.

16. The method of claim 13, wherein the internal supply voltage is a cell plate voltage applied to a memory cell in a semiconductor memory device.

17. The method of claim 13, wherein generating the first output voltage comprises:
generating a pull-up control signal by amplifying a voltage difference between the first reference voltage and the feedback voltage of the first node;

generating a pull-down control signal by amplifying a voltage difference between the second reference voltage and the feedback voltage of the first node;
pulling up the first output voltage of the first node in response to the pull-up control signal; and
pulling down the first output voltage of the first node in response to the pull-down control signal.

18. The method of claim 13, wherein generating the second output voltage comprises:
generating a pull-up control signal by amplifying a voltage difference between the third reference voltage and the feedback voltage of the second node;
generating a pull-down control signal by amplifying a voltage difference between the fourth reference voltage and the feedback voltage of the second node;
pulling up the second output voltage of the second node in response to the pull-up control signal; and
pulling down the second output voltage of the second node in response to the pull-down control signal.

19. The method of claim 13, wherein the first reference voltage has a larger value than the second reference voltage.

20. The method of claim 19, wherein the third reference voltage has a larger value than the first reference voltage by a first voltage difference and the fourth reference voltage has a larger value than the second reference voltage, by a second voltage difference.

* * * * *